United States Patent [19]
Krivanek et al.

[11] Patent Number: 5,517,033
[45] Date of Patent: May 14, 1996

[54] APPARATUS FOR IMPROVED IMAGE RESOLUTION IN ELECTRON MICROSCOPY

[75] Inventors: Ondrej L. Krivanek, Lafayette; Paul E. Mooney, San Leandro; Daniel N. Bui, Castro Valley, all of Calif.

[73] Assignee: Gatan, Inc., Pleasanton, Calif.

[21] Appl. No.: 279,928

[22] Filed: Jul. 25, 1994

[51] Int. Cl.$^6$ .................................................. H01J 37/244
[52] U.S. Cl. ............................................ 250/397; 250/311
[58] Field of Search ..................................... 250/397, 371, 250/310, 306, 307

[56] References Cited

U.S. PATENT DOCUMENTS

| | | | |
|---|---|---|---|
| 4,038,543 | 7/1977 | Krisch et al. | 250/311 |
| 4,211,924 | 7/1980 | Müller et al. | 250/311 |
| 4,810,886 | 3/1989 | Mori et al. | 250/397 |
| 5,013,915 | 5/1991 | Isakozawa et al. | 250/311 |
| 5,065,029 | 11/1991 | Krivanek | 250/441.1 |
| 5,401,964 | 3/1995 | Mancuso | 250/311 |

OTHER PUBLICATIONS

R. Valle et al., "Scattering and Back-Scattering of 1 MeV Electorns", *Ultramicroscopy* 27 (1989) pp. 67–78.
James B. Pawley, "An HVEM Image Intensifier Using a Mini–Lens to Optimize its Spatial Resolution," Thirty–Seventh Annual EMSA Meeting, pp. 592–593 (1979).
James Pawley, "Recent Improvements to the EM–7 at the Madison Biotechnology Resource", Thirty–Eighth Annual EMSA Meeting, pp. 8–11 (1980).

*Primary Examiner*—Jack I. Berman
*Assistant Examiner*—Kiet T. Nguyen
*Attorney, Agent, or Firm*—Killworth, Gottman, Hagan & Schaeff

[57] ABSTRACT

An apparatus for improving the resolution of images produced by an electron microscope is provided and includes an electron beam forming an electron image, a support structure mounted in the path of the electron beam, with the support structure transmitting the electron image. Scintillating material is coated onto the side of the support structure opposite that on which the electron image is incident, the scintillating material converting the electron image into a light image. A mirror is provided for deflecting the optical path of the light image into a CCD camera positioned to receive and record the light image.

22 Claims, 2 Drawing Sheets

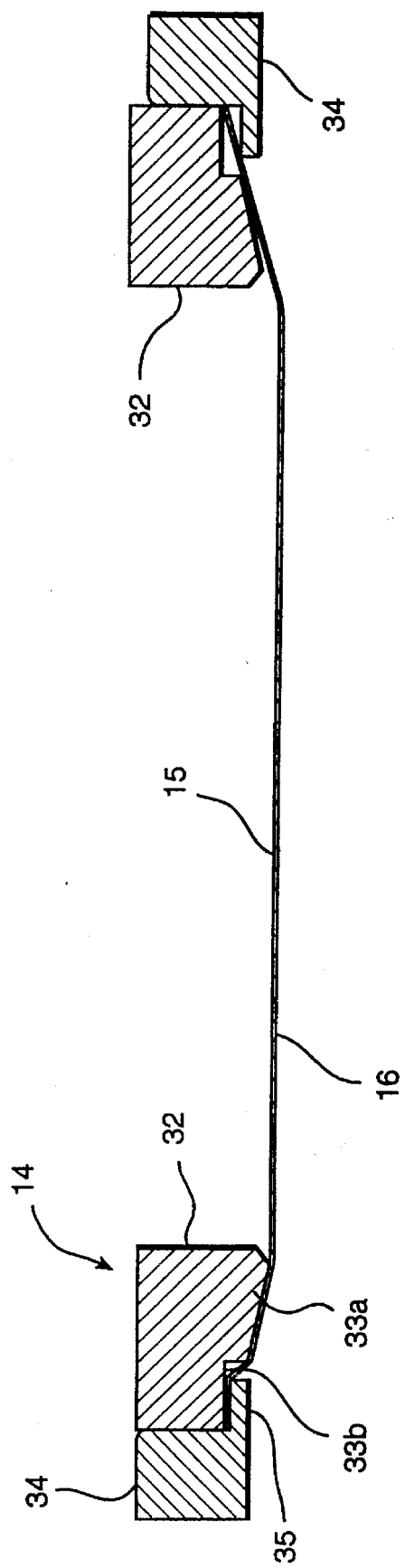

APPARATUS FOR IMPROVED IMAGE RESOLUTION IN ELECTRON MICROSCOPY

BACKGROUND OF THE INVENTION

This invention relates to an apparatus for use in electron microscopes which improves the image resolution of light images formed therein.

Transmission electron microscopes use a beam of accelerated electrons which pass through a sample to provide an electron image and/or diffraction pattern of the sample. To provide a record of these images and/or diffraction patterns, the electrons have been converted into light images using scintillator materials (e.g., phosphors), and the light images and/or patterns are then captured by a camera. While photographic film has long been used, charge-coupled devices (CCD) of the type-originally developed for astronomy to read light images into a computer have found increasing use in this field. Such CCD cameras offer excellent resolution, sensitivity, linearity, up to 2,048×2,048 pixels, are reusable, and make the image available for viewing within seconds of recording.

The final resolution of any camera recording these images and patterns is determined by the combined effect of 1) scattering of the incident electrons by atoms in the scintillator material and supporting structure for the scintillator, 2) spreading and random scattering of the electron generated photons by boundary and grain surfaces in the scintillator, and 3) the resolution of the transfer optics from the scintillator to the camera. The electron scattering is dependent on the accelerating voltage of the imaging electrons and becomes the limiting factor in ultimate resolution for electrons accelerated to 200 keV or higher. At lower voltages, electron scattering is still a factor in determining resolution, and must still be minimized to achieve the best possible resolution.

Certain applications such as tomography require the use of very high accelerating voltages. Because of the thicker samples used in tomography and the rotation used to achieve a three-dimensional image, higher accelerating voltages must be used for transmission of electrons through such samples. Accelerating voltages of 1 MeV and higher are often used.

While resolution loss due to electron scattering can be reduced by making the scintillator material very thin, this necessitates mounting the scintillator on a support structure. When a fiber optic plate is used as the transfer optic (from the scintillator to the camera), it can be used to form a natural support structure for the scintillator. When lens optics are used as the transfer optic, the scintillator typically may be mounted on a transparent piece of glass.

The incident electrons deviate randomly from their initial direction as they move through the solid material of the scintillator and support structure. After the electrons pass through the scintillator, no more light is produced. However, some fraction of the electrons are deflected enough as they pass through the support structure that they are directed back into the scintillator where they cause more light to be emitted, this time at some greater distance from their initial point of entry. Thus, resolution is degraded by scattering in the support structure even though it is not scintillating.

At primary energies of greater than about 0.6 MeV, electrons that have randomly deviated from their initial path, spread sideways in the support structure, and have then been scattered back to the scintillator material produce an unacceptable "tail" in the point spread function (PSF) of the camera. At 0.8 MeV and above, there is also greatly increased damage to the support structure. Such damage to the fiber optics or glass support may be due to an accumulation of high energy electrons in the support leading to volume discharges.

Of additional concern is that with high voltage electrons, there are also forward-going X-rays which are generated by the electrons. Such X-rays are able to penetrate through several centimeters of support structure, such as fiber optics. This may result in an unacceptably high spurious X-ray background in the images. Alternatively, if the thickness of the fiber optics is increased to reduce the X-ray background, then the light intensity of the images will be reduced by factors as high as 10:1.

Accordingly, the need still exists for an apparatus which will improve the ultimate resolution of cameras used to record images from electron microscopes.

SUMMARY OF THE INVENTION

The present invention meets that need by providing an apparatus which avoids the problems of the prior art while providing enhanced image resolution, at low, intermediate, and high accelerating voltages. In accordance with one aspect of the present invention, an apparatus for improving the resolution of images produced by an electron microscope is provided. The apparatus is designed to be mounted within or attached to a projection or specimen chamber of the microscope.

As a part of the device, a support structure is mounted typically in the projection chamber in the path of an electron beam which forms an electron image, including diffraction patterns, from a specimen. The support structure preferably comprises a thin foil of a low molecular weight element. One suitable element is aluminum, and the support may be in the form of a thin aluminum foil having a thickness of between about 1 to about 25 µm. In a preferred construction, the aluminum foil is mounted over a first support ring and flattened by press fitting the foil into a second larger diameter ring. The support structure is designed to transmit the electron image with minimal interaction with the electrons.

A very thin layer of a scintillating material is coated on the side of the support structure opposite that on which the electron image is incident. Preferably, the layer of scintillating material is from about 1 to about 25 µm thick. The scintillating material, such as a phosphor, converts the electron image into a light image.

Means are also provided for deflecting the optical path of the light image. The means for deflecting the optical path of the light image comprises a mirror positioned directly in the path of the electron beam to deflect the light image away from the direction of the electron beam. Preferably, the mirror is aluminum, and is positioned to deflect the light image 90°. By positioning the mirror immediately adjacent the scintillating material, with no intervening optical elements, the amount of light collected is maximized.

A device such as a charge-coupled camera is positioned to receive and record the light image through an optical coupling device. Preferably, a lens optical coupling is used and is positioned between the mirror and the camera. The lens optical coupling comprises a pair of optical lenses mounted facing one another, with the camera on one focal plane and the light image on the other focal plane. The lenses are designed provide a 1:1 optical coupling to optimize the amount of light collected and seen by the camera and to minimize image distortions.

Accordingly, it is a feature of the present invention to provide enhanced image resolution of images and patterns from an electron microscope at low, intermediate, and high accelerating voltages. This, and other features and advantages of the present invention will become apparent from the following detailed description, the accompanying drawings, and the appended claims.

BRIEF DESCRIPTION OF THE DRAWINGS

FIG. 2 is a schematic cross-sectional view of the support structure and scintillating material of the present invention, with the right-hand side of the drawing depicting the support rings prior to securing the foil into position, and the left-hand side depicting the support rings in an interlocked position, stretching, flattening, and securing the foil.

DETAILED DESCRIPTION OF THE PREFERRED EMBODIMENTS

Figure 1:
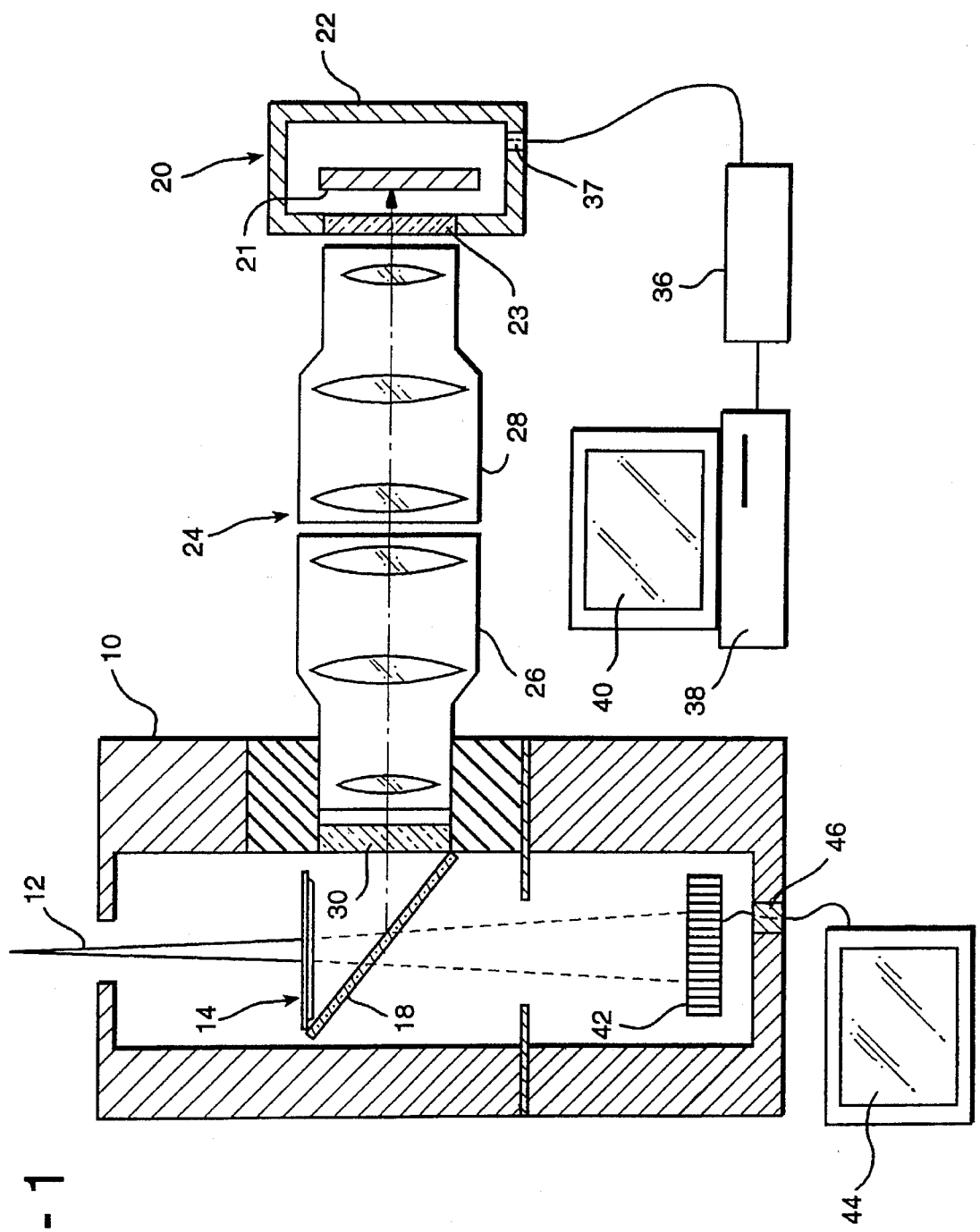
FIG. 1 is a schematic cross-sectional view of the apparatus of the present invention.

Referring to FIG. 1, a schematic view of a slow-scan charge coupled device (CCD) camera 20 mounted off the axis of the projection chamber 10 of a transmission electron microscope (TEM), scanning electron microscope (SEM), or a scanning, transmission electron microscope (STEM) is shown. An electron beam 12 forming an electron image or diffraction pattern from a specimen in the microscope traverses the chamber 10. The present invention is useful in any type of electron microscope using low (up to 100 keV), intermediate (up to 400 keV), and high (600 keV up to 1.25 MeV) accelerating voltages. It is particularly useful to improve image resolution for systems using high accelerating voltages. However, the present invention also provides benefits for low and intermediate voltage operation by permitting the use of smaller pixel CCD cameras while maintaining image resolution and without resort to high demagnification factors which would limit sensitivity.

Projection chamber 10 is normally maintained at a high vacuum (e.g., $10^{-6}$ torr) which is conventionally controlled by a gate valve and vacuum pump arrangement (not shown). Slow scan CCD camera 20 comprises a two-dimensional charge-coupled device sensor 21. CCD sensors are commercially available up to 2,048×2,048 pixels in size from several manufacturers including Scientific Imaging Technologies (SITe), Thomson CSF, and English Electric Valve Ltd. A suitable CCD for use in the present invention is a 1,024×1,024 pixel device available from Scientific Imaging Technologies (SITe).

The CCD must be operated cold to keep its dark current small enough so that the noise in the current accumulated during a typical exposure does not limit the performance of the camera. The typical exposure in an electron microscope is from about 1 to 20 seconds. Maintaining the CCD at a temperature of about −25° to about −30° C. is sufficiently low for the accumulated dark current to be acceptably small at exposure times of up to about 1 minute. Such a temperature is conventionally achieved using a thermoelectric cooling device, schematically shown as cooled, vacuum enclosure 22, whose cold side may be in contact with the CCD.

The CCD is connected to an external electronics unit 36 through a vacuum feed-through 37 which transfers the captured images to the memory of a digital computer 38. The images may be displayed on a view screen 40, such as a CRT, attached to the computer. For the present invention, the images may be digitized with 14 bit dynamic range at 450 kHz and then displayed by a Macintosh Quadra computer using Digital/Micrograph software commercially available from Gatan, Inc., Pleasanton, Calif.

As shown, electron beam 12, in the form of an electron image or diffraction pattern, traverses chamber 10 and impinges on either a fluorescent screen or TV camera 42. Real-time images of the image or pattern are provided via display device 44, such as a TV screen, which is connected to camera 42 via a vacuum feed through connection 46. When an image is desired to be recorded, support structure 14 is moved into the path of the beam on a movable platform.

Support structure 14, as best shown in FIG. 2, includes a pair of support rings 32 and 34, respectively. A thin foil 15 of a low molecular weight element is stretched into a perfectly flat configuration by the interlocking action of the rings. As shown, first support ring 32 includes an angled shoulder portion 33a and a flat land area 33b. Second support ring 34, having an inner diameter which matches the outer diameter of first support ring 32, includes a flange 35 which snaps over land area 33b, stretching foil 15 and securing it into position.

A low molecular weight element is chosen for foil 15 as low molecular weight elements will be transparent to the electron beam and cause less interaction with the electrons as they pass therethrough. Heavier atoms produce greater interactions with the charged electrons. One example of a low molecular weight element is beryllium. However, because of brittleness and toxicity problems with other low molecular weight elements, we have found that an aluminum foil having a thickness of between about 1 to 25 µm is quite suitable for use in the present invention. Aluminum is ductile, easy to handle, inexpensive, and is sufficiently transparent to the accelerated electrons. For low voltage operation, it is desirable to use as thin a foil as possible, preferably having a thickness of from about 1 to 5 µm. Thicker foils, i.e., from about 10 to 25 µm, within the above-disclosed range may be used for higher voltage operation.

The diameter of the foil may be between 4 and 8 cm. Further, while the interlocking rings are a preferred way of stretching and flattening the foil, a polymeric glue or adhesive may also be used to secure the foil 15 to the support. The glue or adhesive is applied at a high temperature, and differential thermal contraction of the foil during cooldown is used to stretch the foil flat.

A very thin layer of a scintillating material 16 is coated onto the underside of foil 15 (i.e., the side of the foil opposite that on which the electron beam is incident. Scintillating material 16 acts to convert the electron image or pattern into a light image as the impinging electron cause the phosphors to give off photons. There are many commercially available phosphors which are suitable for use in the present invention. Preferred phosphors include those which are available as particulate powders, with particle sizes of 1 µm or less. Preferably, the coating of the scintillating phosphor is applied in a thin a layer as possible, with a preferred thickness of from about 1 to about 25 µm. Coating techniques such a solvent slurries and evaporation may be used to apply the coating. A preferred phosphor for use in the present invention is commercially available under the designation P 43.

The thinness of the foil 15 and scintillating material 16 minimizes interactions with the electrons in the beam and reduces backscatter problems. That is, by positioning the scintillating material on the back side of the support, there is less opportunity for electrons to deviate randomly from their paths and create additional spurious background light. This improves the ultimate resolution of the light image produced by the electron image or pattern. Using the foil and scintillating material of the present invention, we have calculated, using a Monte Carlo routine, that average sideways spreading of 1 MeV electrons in the scintillating material is only 10 μm.

Means for deflecting the optical path of the light image produced from scintillating material 16 are positioned directly beneath support structure 14 and without any intervening optical elements such as glass windows or the like. Intervening glass optical elements will tend to be broken down by the high energy electrons, causing a browning effect which reduces the brightness and the resolution of the image. A preferred means is mirror 18. Further, by positioning mirror 18 closely adjacent scintillating material 16, light collection is maximized. Mirror 18 is preferably constructed of aluminum and coated with a thin layer of gold to prevent oxidation of the mirror surface. Aluminum is preferred over nonconductive silvered-glass mirrors as the mirror performs the dual function of deflecting the optical image while acting as a low Z beam dump for the accelerating electron beam. That is, some of the energy in the electron beam will be dissipated by the aluminum in the mirror. This presents a significant advantage over prior art glass mirrors.

The sharp image from the scintillating material 16 is thus deflected by mirror 18 at about a 90° angle away from the direction of electron beam 12, through quartz window 30, and into an optical coupler 24. Quartz window 30 is sealed to maintain the high vacuum in projection chamber 10 and contains a conducting coating. The quartz window is both transparent to the light image as well as being radiation tolerant. Further, by positioning the window 30 out of the direct path of electron beam 12, the incidence of radiation on the window is minimized.

Optical coupler 24 includes first and second lenses 26, 28 mounted facing one another (front-to-front) which projects the light image onto the cooled CCD sensor 21. As shown, CCD sensor 21 is enclosed in a vacuum enclosure 22 having a quartz window 23 to permit the light image to enter. Lenses 26 and 28 are high quality commercially available 130 mm focal length lenses. For example, in a preferred embodiment, lens 26 is a Zeiss Planar T/2 135 mm lens and lens 28 is an OBX131 lens from Optek (Milan, Italy). Both lenses have an f/2 aperture. By mounting the lenses in the front-to-front arrangement, any distortions of the image caused by the lens designs are canceled. The lenses are designed to provide a 1:1 optical coupling to optimize the amount of light collected and seen by the CCD sensor. Further, for operations where sensitivity is not as critical (such as at low and intermediate voltage operation), optical coupling lenses which provide demagnifications of from 1.5:1 to 3:1 may be used in conjunction with smaller-pixel CCD cameras.

In order that the invention may be more readily understood, reference is made to the following example, which is intended to be illustrative of the invention, but is not intended to be limiting in scope.

EXAMPLE

The CCD camera was tested by installing it in a transmission electron microscope, Model 2010, from JEOL, Ltd. operating at 200 keV and in a JEOL, Ltd. ARM (Atomic Resolution Microscope) operating at 0.8–1.25 MeV produced vignetting (gradual fading out of an image near its periphery) of about 30% at the edges of the field of view. Vignetting could be gain normalized away, so that the net effect was more noise in the corners of images recorded with fewer than about 50 fast electrons per pixel.

Due to coupling efficiency of the lens optical coupling, a single 1 MeV electron resulted in about 5 CCD electrons, on average. The point spread function (PSF) was measured and produced a very narrow loss peak at 0.8 MeV operation. The PSF of the present invention operating at 0.8 MeV was comparable to prior art fiber-optically coupled cameras operating at only 100 keV.

Using the CCD camera as a detector for imaging filters designed for 1 and 1.25 MeV operation indicated that, at an incident dose of greater than about 25 fast electrons per pixel, image quality matched the quality obtainable by the use of photographic film.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An apparatus for improving the resolution of images produced by an electron microscope comprising:

an electron beam forming an electron image;

a support structure mounted in the path of said electron beam, said support structure transmitting said electron image;

scintillating material on the side of said support structure opposite that on which said electron image is incident, said scintillating material converting said electron image into a light image;

means for deflecting the optical path of said light image; and a device positioned to receive and record said light image.

2. An apparatus as claimed in claim 1 in which the device is a charge-coupled camera.

3. An apparatus as claimed in claim 1 in which the means for deflecting the optical path of the light image comprises a mirror positioned to deflect the light image away from the direction of the electron beam.

4. An apparatus as claimed in claim 3 in which the mirror is directly in the path of the electron beam.

5. An apparatus as claimed in claim 4 wherein the mirror is positioned immediately adjacent the scintillating material.

6. An apparatus as claimed in claim 3 in which the mirror comprises aluminum.

7. An apparatus as claimed in claim 1 in which the means for deflecting the optical path of the light image deflects the image 90°.

8. An apparatus as claimed in claim 1 in which the support structure comprises a thin aluminum foil having a thickness of between about 1 to about 25 μm.

9. An apparatus as claimed in claim 8 in which the aluminum foil is mounted over a first support ring and flattened by press fitting into a second larger diameter ring.

10. An apparatus as claimed in claim 1 in which the scintillating material is from about 1 to about 25 μm thick.

11. An apparatus as claimed in claim 1 in which the electron beam has been accelerated to at least about 600 keV and the support structure comprises a thin aluminum foil having a thickness of between about 10 to about 25 μm.

12. An apparatus as claimed in claim 1 in which the electron beam has been accelerated to less than about 600 keV and the support structure comprises a thin aluminum foil having a thickness of between about 1 to about 5 μm.

13. An apparatus as claimed in claim 1 further including a lens optical coupling positioned between the mirror and the device to record the light image.

14. An apparatus as claimed in claim 13 wherein the lens optical coupling comprises a pair of optical lenses mounted facing one another.

15. An apparatus as claimed in claim 14 wherein the lenses provide a 1:1 optical coupling.

16. An apparatus as claimed in claim 1 in which the electron beam has been accelerated to at least about 600 keV and the support structure comprises a thin aluminum foil having a thickness of between about 10 to about 25 μm.

17. An apparatus as claimed in claim 1 in which the electron beam has been accelerated to less than about 600 keV and the support structure comprises a thin aluminum foil having a thickness of between about 1 to about 5 μm.

18. An apparatus for improving the resolution of images produced by an electron microscope comprising:

an electron beam forming an electron image;

a support structure mounted in the path of the electron beam, the support structure transmitting the electron image;

scintillating material on the side of the support structure opposite that on which the electron image is incident, the scintillating material converting the electron image into a light image;

a mirror positioned directly in the path of the electron beam to deflect the light image away from the direction of the electron beam;

a lens optical coupling positioned to receive the deflected light image; and a charge-coupled camera positioned along a focal plane of the lens optical coupling to receive and record the light image.

19. An apparatus as claimed in claim 18 wherein the lens optical coupling comprises a pair of optical lenses mounted facing one another.

20. An apparatus as claimed in claim 18 in which the support structure comprises a thin aluminum foil having a thickness of between about 1 to about 25 μm.

21. An apparatus as claimed in claim 20 in which the aluminum foil is mounted over a first support ring and flattened by press fitting into a second larger diameter ring.

22. An apparatus as claimed in claim 18 in which the scintillating material is from about 1 to about 25 μm thick.

* * * * *